(12) United States Patent
Sekine

(10) Patent No.: US 9,887,174 B2
(45) Date of Patent: Feb. 6, 2018

(54) SEMICONDUCTOR DEVICE MANUFACTURING METHOD, SEMICONDUCTOR DEVICE, AND WIRE BONDING APPARATUS

(71) Applicant: SHINKAWA LTD., Tokyo (JP)

(72) Inventor: Naoki Sekine, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 15/239,849

(22) Filed: Aug. 18, 2016

(65) Prior Publication Data
US 2016/0358880 A1 Dec. 8, 2016

Related U.S. Application Data

(63) Continuation of application No. PCT/JP2015/053666, filed on Feb. 10, 2015.

(30) Foreign Application Priority Data

Feb. 21, 2014 (JP) .................................. 2014-032217

(51) Int. Cl.
H01L 23/00 (2006.01)
(52) U.S. Cl.
CPC .............. *H01L 24/78* (2013.01); *H01L 24/48* (2013.01); *H01L 24/85* (2013.01);
(Continued)
(58) Field of Classification Search
CPC ......... H01L 24/48; H01L 24/78; H01L 24/85; H01L 2224/48091; H01L 2224/48235;
(Continued)

(56) References Cited

U.S. PATENT DOCUMENTS 7,658,314 B2 2/2010 Tei et al.
9,245,954 B2 1/2016 Fujii
(Continued)

FOREIGN PATENT DOCUMENTS

JP 2003158149 5/2003
JP 2003318216 11/2003
(Continued)

OTHER PUBLICATIONS

"Office Action of Taiwan Counterpart Application" with English translation thereof, dated Oct. 31, 2016, p. 1-p. 9.

*Primary Examiner* — Shahed Ahmed
(74) *Attorney, Agent, or Firm* — JCIPRNET

(57) ABSTRACT

A semiconductor device manufacturing method includes: raising and moving a bonding tool, while paying out a wire, in a direction from a second toward a first bonding point to form in the wire a cut portion bent in a vicinity of the second bonding point; lowering and moving a tip of the bonding tool to the cut portion; lowering the bonding tool vertically to thin the cut portion; raising the bonding tool while paying out the wire; and moving the bonding tool in a direction away from the first and second bonding points and along a wire direction connecting the first and second bonding points and then cutting the wire at the cut portion to form a wire tail. This allows the length of the wire tail to be adjusted easily and efficiently to be constant.

4 Claims, 8 Drawing Sheets

(52) U.S. Cl.
CPC ............... *H01L 2224/48091* (2013.01); *H01L 2224/48235* (2013.01); *H01L 2224/48472* (2013.01); *H01L 2224/73265* (2013.01); *H01L 2224/7855* (2013.01); *H01L 2224/78301* (2013.01); *H01L 2224/78354* (2013.01); *H01L 2224/78803* (2013.01); *H01L 2224/85205* (2013.01); *H01L 2924/00014* (2013.01); *H01L 2924/15311* (2013.01)

(58) Field of Classification Search
CPC . H01L 2224/48472; H01L 2224/73265; H01L 2224/78301; H01L 2224/78354; H01L 2224/7855; H01L 2224/78803; H01L 2224/85205; H01L 2924/00014; H01L 2924/15311
USPC ....... 257/672, 678, 690, 696, 726, 734, 779, 257/780, 781, 782; 438/106, 111, 123
See application file for complete search history.

(56) References Cited

U.S. PATENT DOCUMENTS

| | | | |
|---|---|---|---|
| 9,337,166 B2 | 5/2016 | Hagiwara et al. | |
| 2007/0235887 A1* | 10/2007 | Kaimori | B23K 20/007 257/784 |
| 2007/0246513 A1 | 10/2007 | Tei et al. | |
| 2008/0197510 A1* | 8/2008 | Mii | B23K 20/004 257/780 |
| 2012/0256314 A1* | 10/2012 | Har | H01L 24/48 257/738 |
| 2013/0119117 A1 | 5/2013 | McGrath | |
| 2014/0138426 A1 | 5/2014 | Hagiwara et al. | |
| 2015/0187729 A1* | 7/2015 | Chew | H01L 24/85 257/784 |
| 2016/0163673 A1 | 6/2016 | Hagiwara et al. | |

FOREIGN PATENT DOCUMENTS

| | | |
|---|---|---|
| JP | 2005123388 | 5/2005 |
| JP | 2007012642 | 1/2007 |
| TW | 359014 | 5/1999 |
| TW | 200741918 | 11/2007 |
| TW | 201314801 | 4/2013 |
| TW | 201327700 | 7/2013 |
| TW | 201349368 | 12/2013 |

* cited by examiner

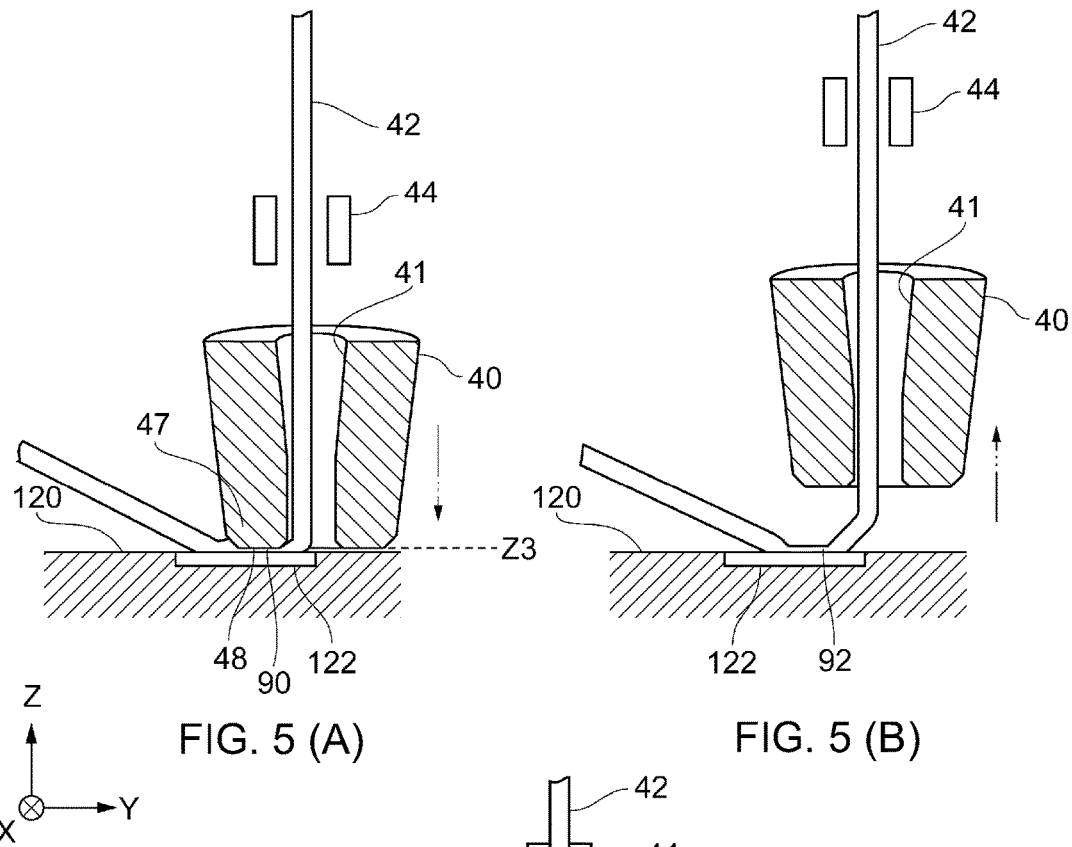
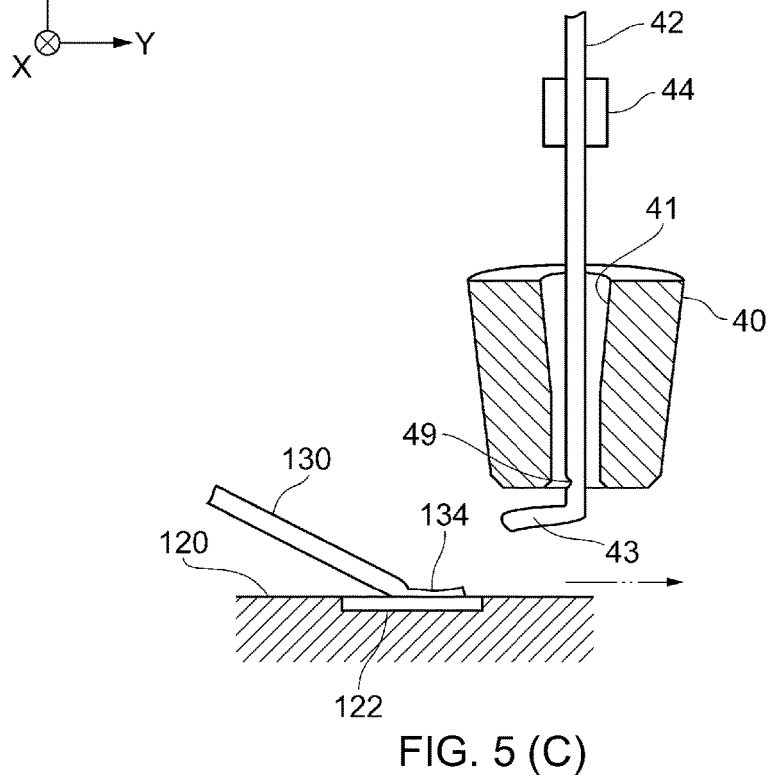
FIG. 5 (A)
FIG. 5 (B)
FIG. 5 (C)

SEMICONDUCTOR DEVICE MANUFACTURING METHOD, SEMICONDUCTOR DEVICE, AND WIRE BONDING APPARATUS

CROSS REFERENCE TO RELATED APPLICATIONS

This application is a Continuation of PCT International Application No. PCT/JP2015/053666, filed on Feb. 10, 2015, which claims priority under 35 U.S.C §119(a) to Patent Application No. 2014-032217, filed in Japan on Feb. 21, 2014, all of which are hereby expressly incorporated by reference into the present application.

TECHNICAL FIELD

The present invention relates to a semiconductor device manufacturing method, a semiconductor device, and a wire bonding apparatus.

BACKGROUND ART

In manufacturing of semiconductor devices, wire bonding is used commonly in which electrodes on a semiconductor chip and electrodes on a substrate, for example, are connected electrically using wires. As an aspect of such a wire bonding technique, there is known a wedge bonding system in which a wire is connected to a bonding target without forming a ball at the tip of the wire. In such a wedge bonding system, a first bonding point and a second bonding point are connected using a wire, followed by the wire extending out of the tip of the bonding tool being cut at a portion, so that a wire tail for the next wire bonding is formed at the tip of the bonding tool, and the wire tail is bonded directly to the next first bonding point without a ball forming step.

Given the situation where the first bonding point is an electrode on a semiconductor chip, however, the tip of the wire tail after bonding to the first bonding point may come into contact with an adjacent electrode and/or a passivation film on the semiconductor chip, resulting in a damage to or a defect of the semiconductor chip.

In order to solve such a problem, there has been proposed a technique, as described in Patent document 1, for example, in which a member (mold) for bending the tip of a wire tail upward is provided and, before bonding to a first bonding point, the bonding tool is moved to above the member for arrangement of the shape of the wire tail, which requires the bonding tool to be moved with each wire bonding and thus is not exactly a simple and efficient manufacturing method. Alternatively, in view of the fact that such a problem can arise only at the first bonding point, it is conceivable to solve the problem through reverse bonding in which bonding is performed in reverse order, which disadvantageously puts a limitation on the order of bonding and thus is not exactly a wire bonding method of a high degree of design freedom.

CITATION LIST

Patent Document

Patent document 1: JP2003-318216A

SUMMARY

Technical Problem

It is hence that the present invention provides a semiconductor device manufacturing method, a semiconductor device, and a wire bonding apparatus with which the above-described problem can be solved.

Solution to Problem

A semiconductor device manufacturing method according to an aspect of the present invention is for a semiconductor device having a wire loop for connection between a first bonding point and a second bonding point, the method including: a first bonding step of bonding a wire inserted through a bonding tool to the first bonding point; a wire looping step of looping the wire while paying out the wire; a second bonding step of bonding the wire to the second bonding point; a cut portion forming step of raising the bonding tool while paying out the wire and moving the bonding tool in a direction from the second bonding point toward the first bonding point to form a cut portion in the wire extending out of the tip of the bonding tool, the cut portion being bent in the vicinity of the second bonding point; a bonding tool moving step of lowering the bonding tool and moving the tip of the bonding tool to the cut portion of the wire while being pressed against the wire; a thin portion forming step of lowering the bonding tool vertically toward the second bonding point for compression to thin the cut portion of the wire; a bonding tool raising step of raising the bonding tool while paying out the wire; and a wire tail forming step of moving the bonding tool in a direction away from the first bonding point and the second bonding point and along a wire direction connecting the first bonding point and the second bonding point and then cutting the wire at the cut portion to form a wire tail at the tip of the bonding tool.

In accordance with the arrangement above, the cut portion, which is in a state where the wire can be cut easily thereat, is formed in the vicinity of the second bonding point in the wire extending out of the tip of the bonding tool, and the wire can be cut at the cut portion, whereby the wire tail can be adjusted easily and efficiently to have a constant length. It is therefore possible to, for example, reduce the length of the wire tail and, for example, arrange a tip portion of the wire reliably within the region of an electrode during bonding at the first bonding point for the next wire bonding, allowing for narrowed pitch and increased reliability of the semiconductor device.

In the semiconductor device manufacturing method, in the cut portion forming step, the bonding tool can be raised to a first height; in the bonding tool moving step, the bonding tool can be lowered to a second height lower than the first height and, at the second height, the bonding tool can be moved to the cut portion of the wire while the tip of the bonding tool is pressed against the wire; and in the thin portion forming step, the bonding tool can be used for compression to a third height lower than the second height.

In the semiconductor device manufacturing method, in the bonding tool moving step, the tip of the bonding tool can be pressed against the wire at a point nearer the first bonding point than the second bonding point.

In the semiconductor device manufacturing method, in the thin portion forming step, the bonding tool can be moved along the wire direction while being kept at the third height.

A semiconductor device according to an aspect of the present invention includes a first electrode at which a wire tail is bonded as a first bonding point; a second electrode at which a wire is bonded as a second bonding point; and a wire loop extended in a predetermined shape for connection between the first electrode and the second electrode, in which the wire loop has a first bonded portion with respect to the first electrode, and a first tip portion of the wire loop on the side of the first bonded portion is arranged within a region of the first electrode in a plan view and formed to become integrated with the first bonded portion to form a thin portion thinner than the diameter of the wire.

In accordance with the arrangement above, it is possible to avoid the tip portion of the wire running off the first bonding point to come into contact with another electrode or the like, which can avoid or reduce damages to or defects of the semiconductor device. It is therefore possible to provide a highly reliable semiconductor device that can accommodate a narrow pitch (e.g. a staggered pad arrangement).

In the semiconductor device, the portion of the wire loop rising from the first electrode can be formed with a recessed portion.

In the semiconductor device, the first electrode can be provided on a semiconductor chip and the region of the first electrode can be a region exposed through a passivation film formed on the semiconductor chip, and the second electrode can be provided on a substrate on which the semiconductor chip is mounted.

A wire bonding apparatus according to an aspect of the present invention is for manufacturing a semiconductor device having a wire loop for wire-connection between a first bonding point and a second bonding point, the wire bonding apparatus including: a bonding arm movable freely in an XY plane and in a Z direction within a bonding region; an ultrasonic horn attached to the end of the bonding arm; a bonding tool attached to one end of the ultrasonic horn and configured to press a wire inserted therethrough against the first bonding point and the second bonding point that serve as bonding targets; and a control unit for controlling the operation of the bonding tool, in which the control unit is configured to be capable of performing the steps of: raising the bonding tool while paying out the wire and moving the bonding tool in a direction from the second bonding point toward the first bonding point to form a cut portion in the wire extending out of the tip of the bonding tool, the cut portion being bent in the vicinity of the second bonding point; lowering the bonding tool and moving the tip of the bonding tool to the cut portion of the wire while being pressed against the wire; using the bonding tool for compression to thin the cut portion of the wire; raising the bonding tool while paying out the wire; and moving the bonding tool in a direction away from the second bonding point and then cutting the wire at the cut portion to form a wire tail at the tip of the bonding tool.

In accordance with the arrangement above, the cut portion, which is in a state where the wire can be cut easily thereat, is formed in the vicinity of the second bonding point in the wire extending out of the tip of the bonding tool, and the wire can be cut at the cut portion, whereby the wire tail can be adjusted easily and efficiently to have a constant length. It is therefore possible to, for example, reduce the length of the wire tail and, for example, arrange a tip portion of the wire reliably within the region of an electrode during bonding at the first bonding point for the next wire bonding, allowing for narrowed pitch and increased reliability of the semiconductor device.

Advantageous Effects of the Invention

In accordance with the present invention, the length of a wire tail during wire bonding can be adjusted easily and efficiently to be constant. It is therefore possible to provide a semiconductor device manufacturing method, a semiconductor device, and a wire bonding apparatus that can accommodate narrowed pitch and increased reliability.

BRIEF DESCRIPTION OF THE DRAWINGS

FIG. 5 (A) to 5 (C) illustrate the semiconductor device manufacturing method according to the embodiment.

DESCRIPTION OF EMBODIMENTS

Embodiments of the present invention will hereinafter be described. In the following description of the drawings, identical or similar components are designated by the same or similar reference symbols. The drawings are illustrative only and the dimensions and geometries of various parts are schematic only, and the technical scope of the present invention should not be understood as being limited to the embodiments.

Figure 1:
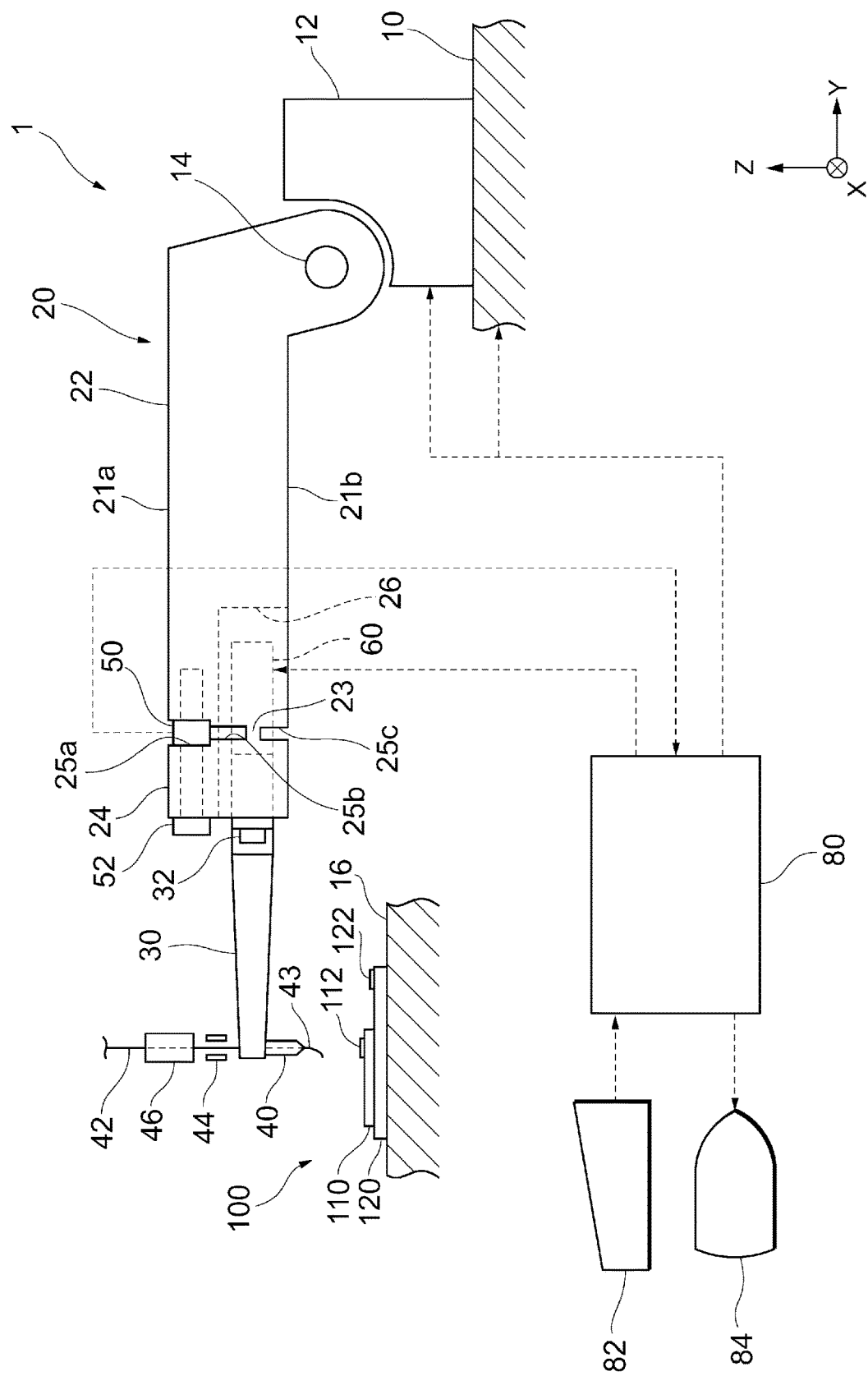
FIG. 1 illustrates a wire bonding apparatus according to an embodiment.
Figure 2:
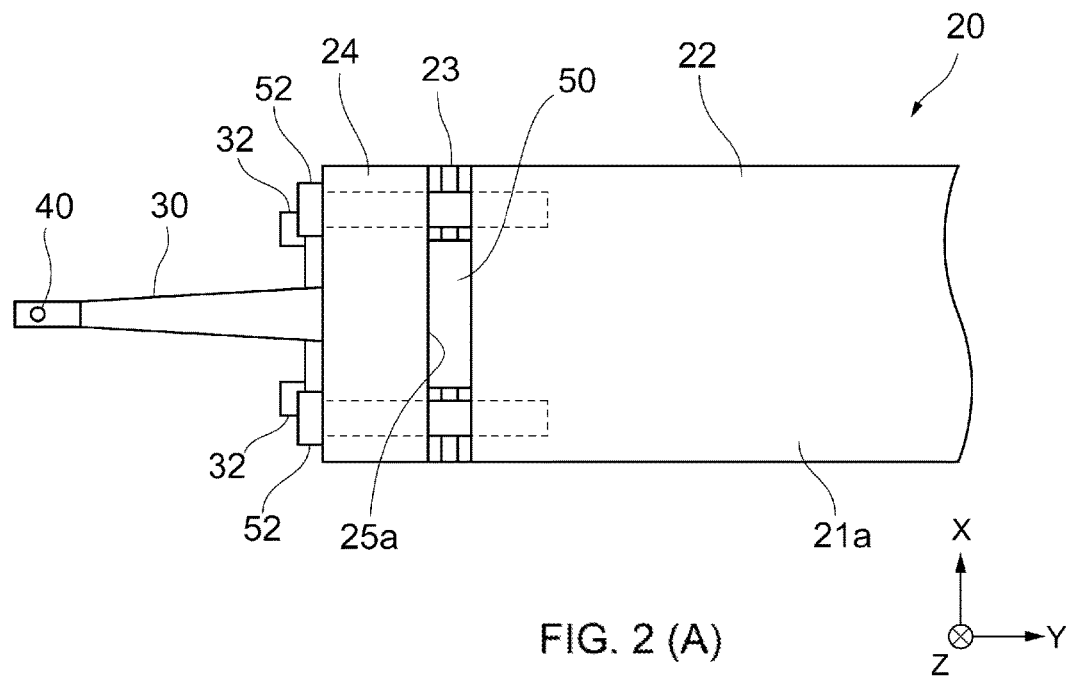
FIGS. 2 (A) and 2 (B) are top and bottom plan views in a plane of a bonding arm of the wire bonding apparatus according to the embodiment.
Figure 2:
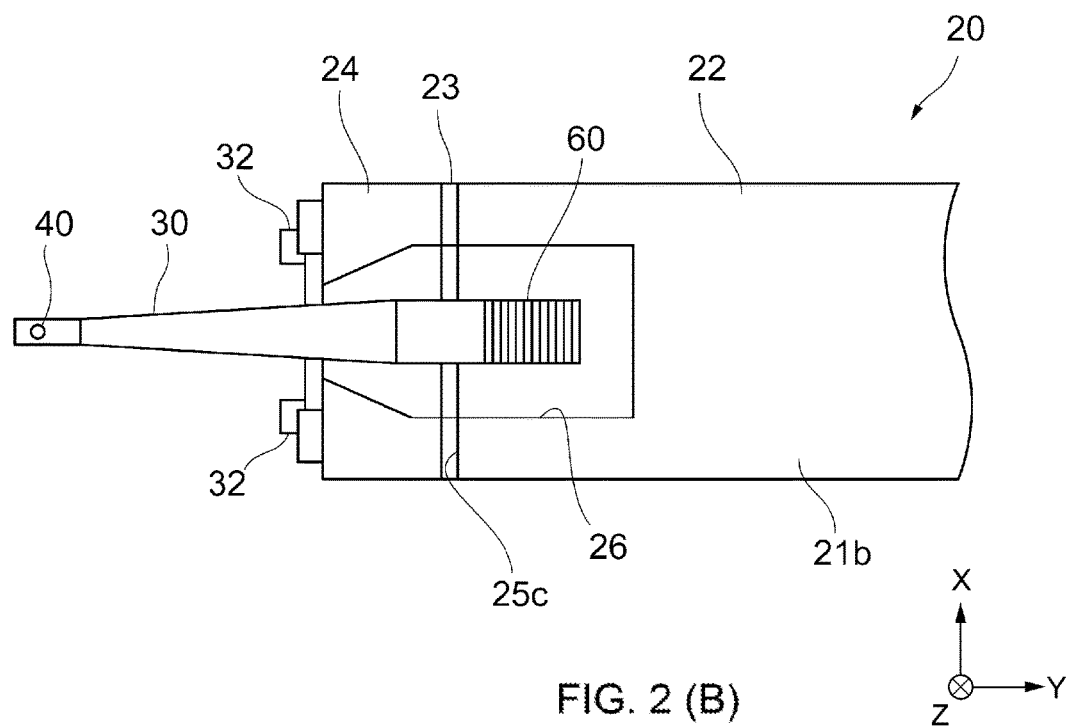

FIG. 1 illustrates a wire bonding apparatus according to an embodiment and FIG. 2 is a partially enlarged view of a bonding arm of the wire bonding apparatus, where FIG. 2 (A) is a top plan view of the bonding arm and FIG. 2 (B) is a bottom plan view of the bonding arm.

As shown in FIG. 1, the wire bonding apparatus 1 includes an XY drive mechanism 10, a bonding arm 20, an ultrasonic horn 30, a bonding tool 40, a load sensor 50, an ultrasonic vibrator 60, and a control unit 80.

The XY drive mechanism 10 is configured to be movable in the X and Y axis directions (planar direction) and the XY drive mechanism (linear motor) 10 is provided with a Z drive mechanism (linear motor) 12 capable of moving the bonding arm 20 in the Z axis direction (vertical direction). The bonding arm 20 is configured to be movable freely in the XY plane and the Z direction within a bonding region.

The bonding arm 20 is supported with an arm supporting shaft 14 and configured to be swingable with respect to the XY drive mechanism 10. The bonding arm 20 is formed in an approximately rectangular parallelepiped shape so as to extend from the XY drive mechanism 10 toward a bonding stage 16 on which a bonding target 100 is placed. The bonding arm 20 includes an arm base end portion 22 attached to the XY drive mechanism 10, an arm end portion 24 positioned on the end side of the arm base end portion 22 and attached with the ultrasonic horn 30, and a flexible connecting portion 23 connecting the arm base end portion 22 and the arm end portion 24. The connecting portion 23 is constituted with slits 25*a* and 25*b* extending in a direction from the top surface 21*a* toward the bottom surface 21*b* of the bonding arm 20 and having a predetermined width and a slit 25c extending in a direction from the bottom surface 21b toward the top surface 21a of the bonding arm 20 and having a predetermined width. Since the connecting portion 23 is thus thinned locally with the slits 25a, 25b, and 25c, the arm end portion 24 is flexible with respect to the arm base end portion 22.

As shown in FIGS. 1 and 2 (B), a recessed portion 26 in which the ultrasonic horn 30 is housed is formed in the bottom surface 21b of the bonding arm 20. The ultrasonic horn 30 is housed in the recessed portion 26 of the bonding arm 20 and, in this state, attached to the arm end portion 24 using a horn fixing screw 32. The ultrasonic horn 30 holds, at a tip portion thereof extending out of the recessed portion 26, the bonding tool 40, and the ultrasonic vibrator 60 for generating ultrasonic vibrations is provided in the recessed portion 26. Ultrasonic vibrations can be generated by the ultrasonic vibrator 60, transmitted through the ultrasonic horn 30 to the bonding tool 40, and provided through the bonding tool 40 to the bonding target. The ultrasonic vibrator 60 is, for example, a piezoelectric vibrator.

Also, as shown in FIGS. 1 and 2 (A), the slits 25a and 25b are formed in the top surface 21a of the bonding arm 20 in this order from the top surface 21a toward the bottom surface 21b. The upper slit 25a is formed to be wider than the lower slit 25b. The load sensor 50 is then provided in this widely formed upper slit 25a. The load sensor 50 is fixed to the arm end portion 24 using a pre-compressing screw 52. The load sensor 50 is arranged in a manner sandwiched between the arm base end portion 22 and the arm end portion 24. That is, the load sensor 50 is offset from the longitudinal central axis of the ultrasonic horn 30 in a direction toward and away from the bonding target and installed between the center of rotation of the bonding arm 20 and the surface of the arm end portion 24 on which the ultrasonic horn 30 is mounted (i.e. the end surface of the arm end portion 24 on the side of the bonding tool 40). Since the ultrasonic horn 30 holding the bonding tool 40 is then mounted on the arm end portion 24 as mentioned above, the arm end portion 24 undergoes a deflection with respect to the arm base end portion 22 under loading at the tip of the bonding tool 40 due to a reaction force from the bonding target, whereby the load sensor 50 can sense a load. The load sensor 50 is, for example, a piezoelectric load sensor.

Figure 4:
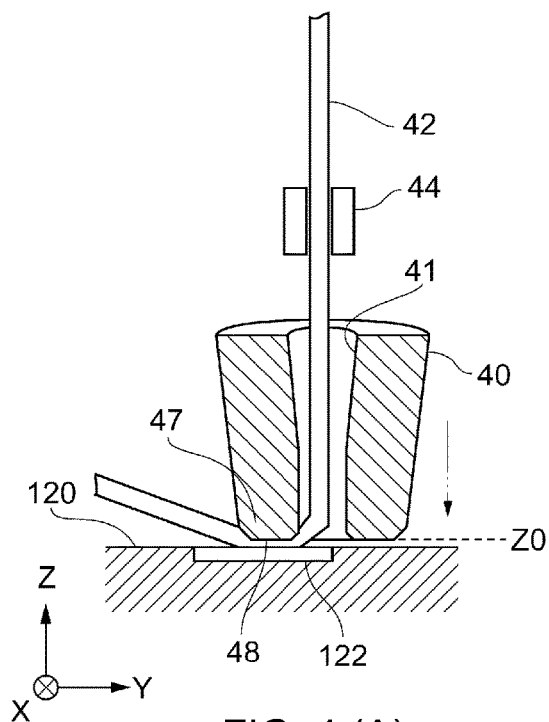
FIG. 4 (A) to 4 (D) illustrate the semiconductor device manufacturing method according to the embodiment.
Figure 4:
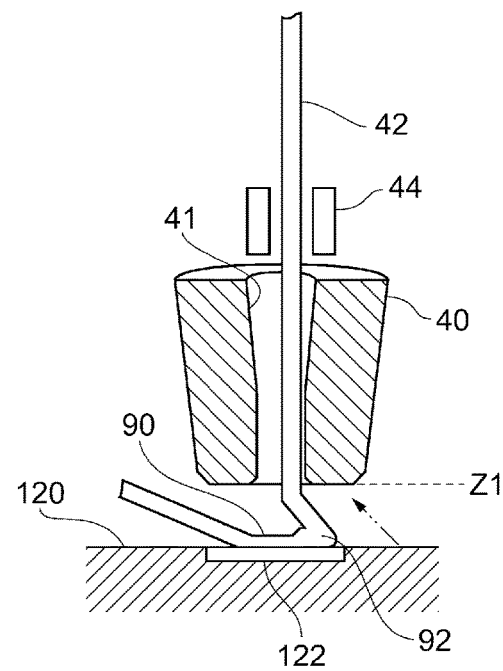
Figure 4:
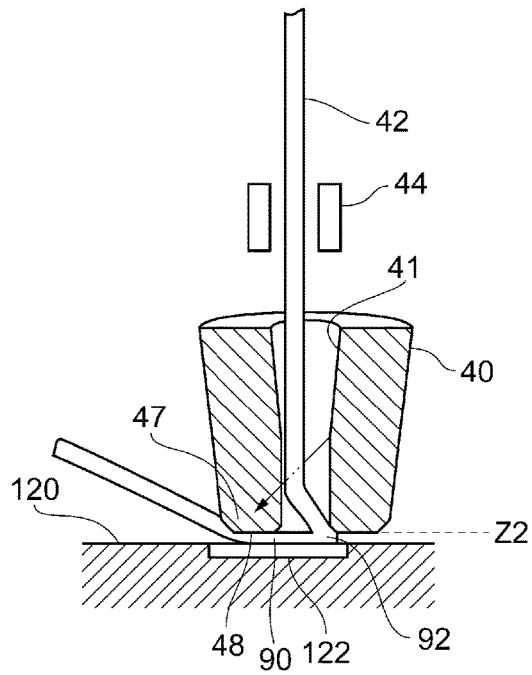
Figure 4:
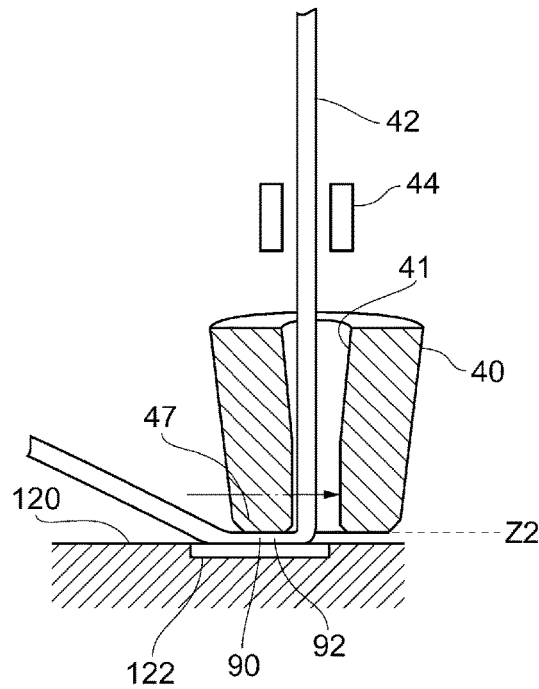

The bonding tool 40 is used for insertion of a wire 42 therethrough and, for example, a capillary provided with an insertion hole 41 (see FIG. 4 (A)). In this case, the wire 42 for bonding is inserted through the insertion hole 41 of the bonding tool 40, from the tip of which a portion of the wire 42 can be paid out. A pressing portion 47 for pressing the wire 42 (see FIG. 4 (A)) is also provided at the tip of the bonding tool 40. The pressing portion 47 has a shape rotationally symmetric about the axial direction of the insertion hole 41 of the bonding tool 40 and has a pressing surface 48 on the underside around the insertion hole 41.

The bonding tool 40 is attached replaceably to the ultrasonic horn 30 with a spring force or the like. Above the bonding tool 40, there is also provided a wire clamper 44 configured to restrain or release the wire 42 at predetermined timing. Above the wire clamper 44, there is further provided a wire tensioner 46 through which the wire 42 is inserted, the wire tensioner 46 configured to give a moderate tension to the wire 42 during bonding.

The material of the wire 42 is selected appropriately for good workability, low electrical resistance, and the like, employing, for example, gold (Au), aluminum (Al), copper (Cu), or silver (Ag). It is noted that a portion 43 of the wire 42, extending out of the tip of the bonding tool 40, is to be bonded to a first bonding point.

The control unit 80 is connected to the XY drive mechanism 10, the Z drive mechanism 12, the ultrasonic horn 30 (ultrasonic vibrator 60), and the load sensor 50 and can control the operation of these components to perform processing required for wire bonding. The control unit 80 includes an interface (not shown) for transmitting and receiving signals to/from components such as the XY drive mechanism 10, the Z drive mechanism 12, the load sensor 50, the ultrasonic horn 30 (ultrasonic vibrator 60), and the wire clamper 44. Specifically, the control unit 80 performs control on the operation of the bonding tool, such as control on the moving distance of the bonding tool 40 in the X, Y, and Z axis directions and the loading in the Z direction, control on the opening and closing operation of the wire clamper 44, the timing, duration, and scrubbing operations of ultrasonic vibrations to be given to the bonding tool 40.

The control unit 80 is also connected with an operation unit 82 for inputting control information and a display unit 84 for outputting control information, with which an operator can input required control information through the operation unit 82 while viewing the screen on the display unit 84. It is noted that the control unit 80 is a computing device including, for example, a CPU and a memory, and that a bonding program or the like for performing processing required for wire bonding is preliminarily stored in the memory. The control unit 80 includes means for performing processing (program for causing the computer to perform processing) for control on the operation of the bonding tool 40 to be described in the semiconductor device manufacturing method below.

Next will be described a semiconductor device manufacturing method according to this embodiment with reference to FIGS. 3 to 6. The semiconductor device manufacturing method includes a wire bonding method to be implemented using the wire bonding apparatus 1.

Figure 3:
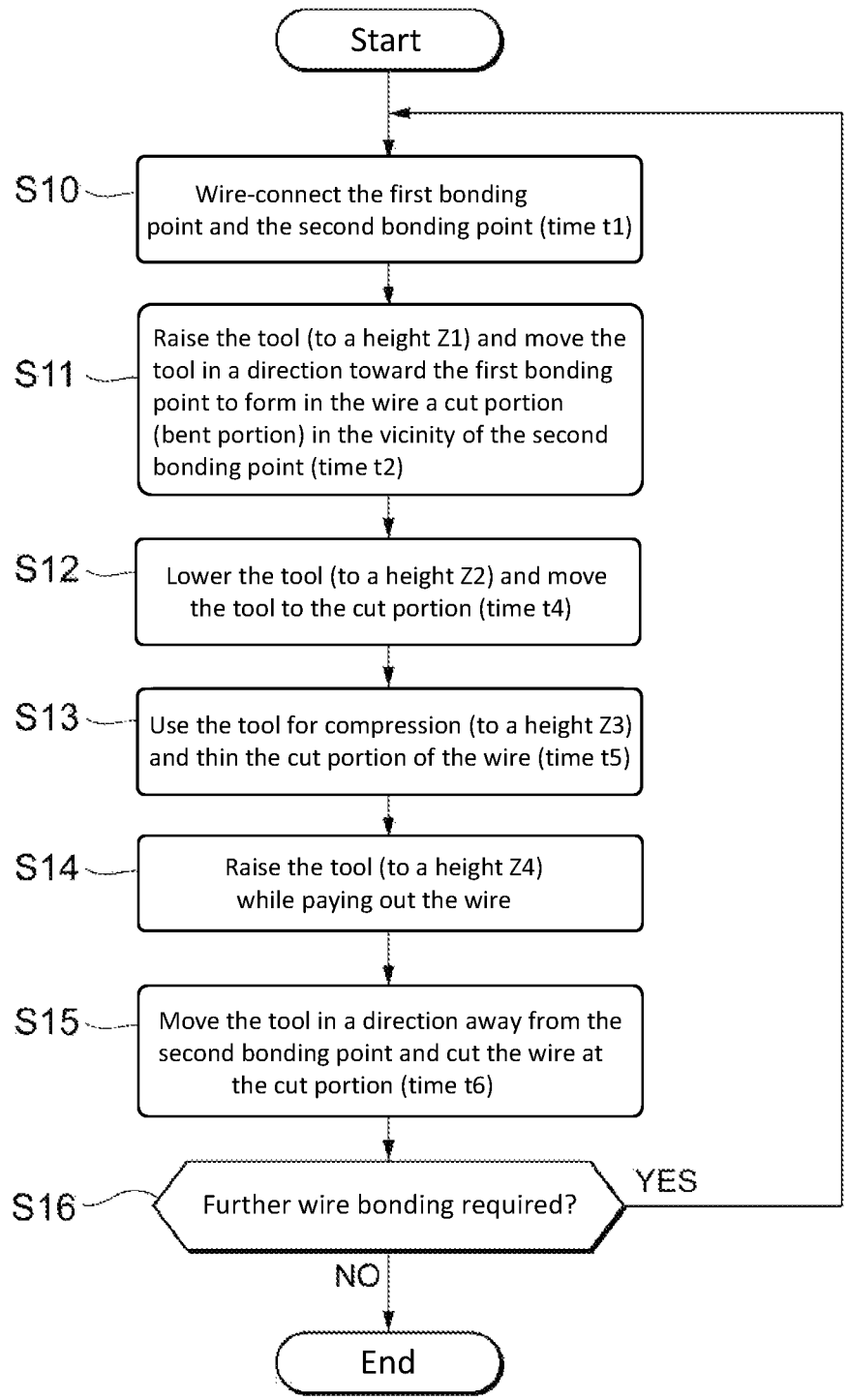
FIG. 3 is a flow chart of a semiconductor device manufacturing method according to the embodiment.
Figure 6:
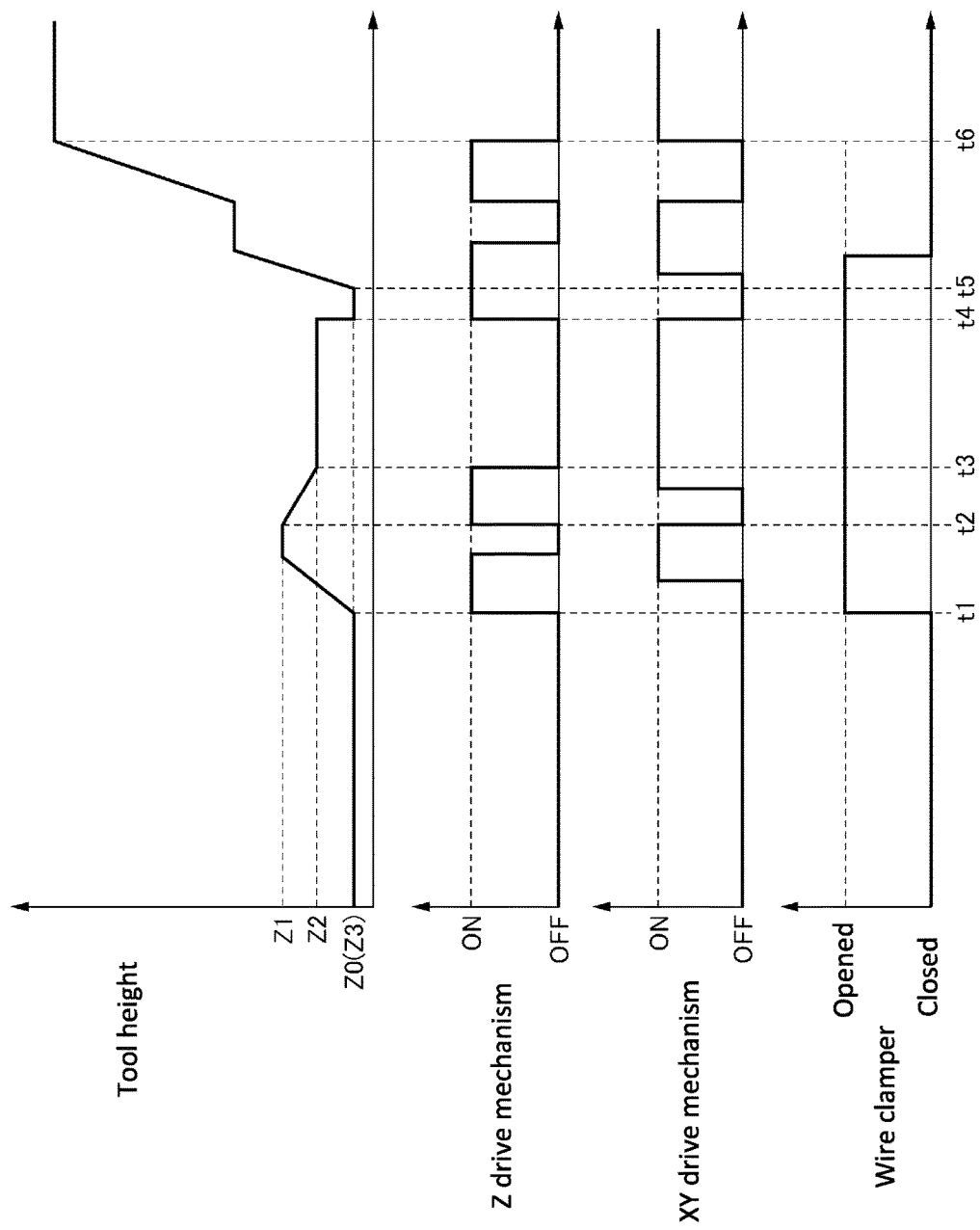
FIG. 6 is a timing diagram for the semiconductor device manufacturing method according to the embodiment.

Here, FIG. 3 is a flow chart of the semiconductor device manufacturing method, FIG. 4 (A) to 4 (D) and FIG. 5 (A) to 5 (C) illustrate wire bonding processing. Also, FIG. 6 is a timing diagram for the semiconductor device manufacturing method. It is noted that the X, Y, and Z axis directions shown in FIG. 4 (A) correspond to the X, Y, and Z axis directions in FIGS. 1, 2 (A), and 2 (B), which apply equally in FIG. 4 (A) to 4 (D), FIG. 5 (A) to 5 (C), and FIG. 6.

First, the bonding target 100 is provided on the bonding stage 16.

As shown in FIG. 1, the bonding target 100 has a first bonding point and a second bonding point to be connected electrically through the semiconductor device manufacturing method of this embodiment. Here, the first bonding point refers to the former bonded site of two wire-connected points, while the second bonding point refers to the latter bonded site of the two points.

The bonding target 100 is a semiconductor device including at least one semiconductor chip, for example, a semiconductor chip 110 having multiple electrodes 112 as the first bonding point and a substrate 120 having multiple electrodes 122 as the second bonding point, as shown in FIG. 1, and wire loops can be formed through wire bonding to electrically connect the electrodes 112 and the electrodes 122. On the surface of the semiconductor chip 110 on which the electrodes 112 are formed (on which semiconductor elements are formed), there is formed a passivation film 114 as a protective film (not shown in FIG. 1; see FIG. 7), and the multiple electrodes 112 are exposed, respectively, through openings in the passivation film. The semiconductor chip 110 is mounted on the substrate 120. In this aspect, the bonding in the order from the electrodes 112 on the semiconductor chip 110 to the electrodes 122 on the substrate 120 is usually called forward bonding. While an example of such forward bonding will be described hereinafter, the wire bonding of this embodiment can also be applied to so-called reverse bonding in which bonding is performed in the order from the electrodes 122 on the substrate 120 to the electrodes 112 on the semiconductor chip 110.

<Processing Before Time t0 and from t0 to t1>

As shown in FIG. 3, one of the electrodes 112 on the semiconductor chip 110 serving as the first bonding point and one of the electrodes 122 on the substrate 120 serving as the second bonding point are wire-connected (S10).

Specifically, a portion of the wire extending out of the tip of the bonding tool 40 is bonded to the electrode 112 (first bonding point) on the semiconductor chip 110, and then the bonding tool 40 is moved along a predetermined trajectory while the wire is paid out from the tip of the bonding tool 40 so that the wire is looped and the bonding tool 40 is moved to above the electrode 122 (second bonding point) on the substrate 120 and then lowered. As shown in FIGS. 4 (A) and 6, the bonding tool 40 is then used for compression to a height Z0 with the wire clamper 44 being closed from time t0 to t1 so that a portion of the wire 42 is bonded to the electrode 122 on the substrate 120. Specifically, the portion of the wire 42 is compressed by the pressing portion 47 (pressing surface 48) of the bonding tool 40. Upon this, heat, ultrasound, and scrubbing operations are applied, as needed, to bond the wire and the electrode. The electrode 112 serving as the first bonding point and the electrode 122 serving as the second bonding point are thus wire-connected.

<Processing from Time t1 to t5>

After the bonding at the second bonding point, the bonding tool 40 is raised to a height Z1 and moved in a direction from the second bonding point toward the first bonding point while the wire 42 is paid out to form a cut portion 92 in the vicinity of the second bonding point in the wire 42 extending out of the tip of the bonding tool 40, as shown in FIG. 3 (S11). For example, as shown in FIG. 6, the Z drive mechanism 12 is activated at time t1 to raise the bonding tool 40 and then the XY drive mechanism 10 is activated to move the bonding tool 40 in a direction toward the first bonding point (in the Y direction in FIG. 4 (B)) so that the bonding tool 40 is moved obliquely upward toward the first bonding point and, at time t2, the bonding tool 40 is arranged at a height Z1 as shown in FIG. 4 (B). In this case, the Y-directional moving distance of the bonding tool 40 from FIG. 4 (A) to FIG. 4 (B) can be adjusted appropriately and can be approximately equal to, for example, the diameter of the wire. As shown in FIG. 4 (B), at time t2, the cut portion 92 of the wire is a bent portion formed by the Y-directional movement of the bonding tool 40 resulting in bending of the wire. The cut portion 92 of the wire is also provided in the vicinity of a portion 90 near the second bonding point where the wire and the electrode are bonded.

The bonding tool 40 is then lowered to a height Z2 and moved to the cut portion 92 while the tip of the bonding tool 40 is pressed against the wire 42 (S12). For example, as shown in FIG. 6, the Z drive mechanism 12 is activated at time t2 to lower the bonding tool 40 and then the XY drive mechanism 10 is activated so that the bonding tool 40 is further moved obliquely downward toward the first bonding point and, at time t3, the bonding tool 40 is arranged at the height Z2 as shown in FIG. 4 (C). Upon this, the pressing portion 47 (pressing surface 48) at the tip of the bonding tool 40 is in a state pressed against a portion of the wire 42. The position at which the tip of the bonding tool 30 is in contact with the wire can be the bonded portion 90 over the second bonding point or the portion of the wire rising from the second bonding point (e.g. the position at which no stitch is formed during bonding at the second bonding point). After time t3, with the height Z2 being kept, the XY drive mechanism 10 is activated to pull the bonding tool 40 in the Y direction in a manner sliding on the bonded portion 90, while the tip thereof is pressed against the wire 42, to thereby move the bonding tool 40 to the cut portion 92 as shown in FIG. 4 (D).

When the bonding tool 40 is arranged on the cut portion 92 of the wire, the pressing portion 47 (pressing surface 48) of the bonding tool 40 is used to compress and thin the cut portion 92 (S13). Specifically, as shown in FIGS. 5 (A) and 6, the bonding tool 40 is used for compression to a height Z3 from time t4 to t5 so that the pressing portion 47 (pressing surface 48) of the bonding tool 40 plastically deforms and thins the cut portion 92. This causes the cut portion 92 to be formed into a thin portion. It is noted that during at least a portion of the time from t4 to t5, the XY drive mechanism 10 can be activated to move the bonding tool 40, while being kept at the height Z3, in a direction away from the first and second bonding points and along a wire direction (connecting the first bonding point and the second bonding point in the XY plane).

Thus, during the time from t1 to t5, the wire 42 is worked to be bent at least one time and applied with a stress to thereby be plastically deformed and thinned, so that the cut portion 92 has a reduced rigidity or tensile strength and the wire can be cut easily at the cut portion 92. It is noted that during the time from t1 to t5, the wire clamper 44 is opened for controlling the operation of the bonding tool 40, as shown in FIG. 6.

<Processing from Time t5 to t6>

After the plastic deformation of the cut portion 92, the bonding tool 40 is raised while the wire 42 is paid out (S14). Specifically, as shown in FIGS. 5 (B) and 6, with the wire clamper 44 being opened at time t5, the Z drive mechanism 12 is activated to raise the bonding tool 40. This causes the wire 42 to be extended out of the tip of the bonding tool 40.

Thereafter, the bonding tool 40 is moved in a direction away from the second bonding point to cut the wire 42 at the cut portion 92 (S15). Specifically, as shown in FIG. 6, the Z drive mechanism 12 is activated to raise the bonding tool 40 and, with the wire clamper 44 being closed, the XY drive mechanism 10 is also activated to move the bonding tool 40 in a direction away from the second bonding point (in the Y direction opposite to the first bonding pint). Thus, at any timing to time t6 at which the bonding tool 40 is raised, the wire 42 is applied with a tensile stress to be cut at the cut portion 92. The moving trajectory of the bonding tool 40 in this case is not particularly restrictive, but can include, for example, a rise at time t5, a subsequent movement obliquely upward toward the opposite side of the first bonding point, and a further horizontal (Y-directional) movement. Also, the timing at which the wire 42 is cut is not particularly restrictive, but can be, for example, when the Z drive mechanism 12 is not activated and the XY drive mechanism 10 is activated so that the bonding tool 40 is moved in the Y direction, as shown in FIG. 5 (C).

Through such processing, there can be formed a wire loop 130 extended in a predetermined shape for connection between the first bonding point and the second bonding point and a wire bonded portion 134 on the electrode 122 serving as the second bonding point, as shown in FIG. 5 (C).

At the tip of the bonding tool 40, there is also formed a wire tail 43. Since the wire is cut at a predetermined position (at the position of the cut portion 92) in the vicinity of the second bonding point, the length of the wire tail 43 can be controlled by the amount of pay-out of the wire. In addition, the wire 42 inserted through the bonding tool 40 is formed with a recessed portion 49 in the vicinity of an opening of the insertion hole 41 of the bonding tool 40. The recessed portion 49 is formed by the moving operation of the bonding tool 40 in the cutting step, being due to a tool impression formed when the opening end portion of the insertion hole 41 of the bonding tool 40 comes into contact with the wire 42.

After the wire loop 130 connecting the first bonding point and the second bonding point is thus formed and the wire tail 43 is formed at the tip of the bonding tool 40 as just described, it is determined whether or not further wire bonding is required for the bonding target 100 (S16) and, if required (Yes in S16), the bonding tool 40 is moved to the first bonding point for the next wire bonding and the wire tail 43 is bonded to the first bonding point to repeat the sequential steps S10 to S15. On the other hand, if no further wire bonding is required and the wire bonding for the bonding target 100 is fully completed (No in S16), the wire bonding step for the bonding target 100 is terminated.

As described heretofore, in accordance with this embodiment, the cut portion 92, which is in a state where the wire 42 can be cut easily thereat, is formed in the vicinity of the second bonding point (electrode 122) in the wire extending out of the tip of the bonding tool 40, and the wire 42 can be cut at the cut portion 92, whereby the wire tail 43 can be adjusted easily and efficiently to have a constant length. It is therefore possible to, for example, reduce the length of the wire tail 43 and, for example, arrange the tip portion of the wire 42 reliably within the region of an electrode in a plan view during bonding at the first bonding point (electrode 112) for the next wire bonding, allowing for narrowed pitch and increased reliability of the semiconductor device.

Figure 7:
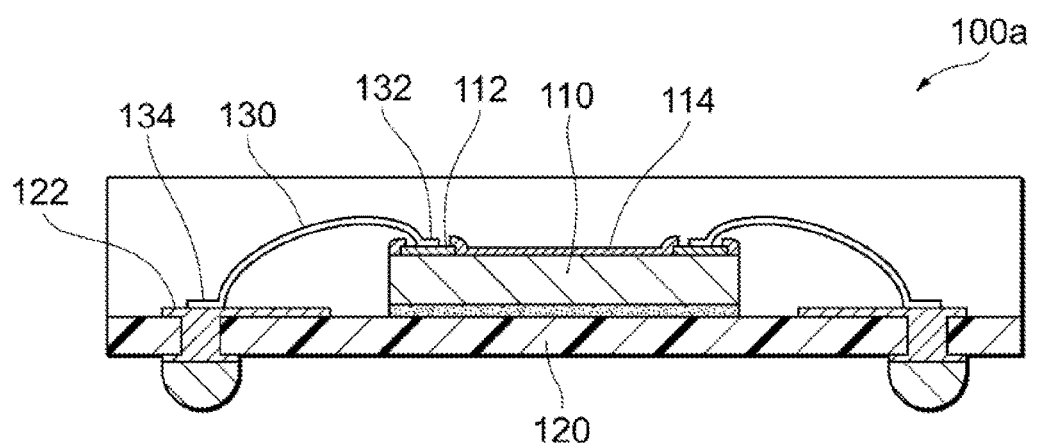
FIG. 7 illustrates a semiconductor device manufactured using the semiconductor device manufacturing method according to the embodiment.
Figure 8:
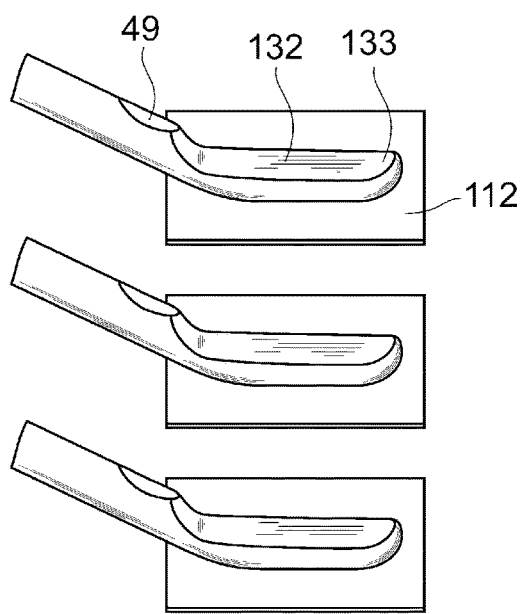
FIGS. 8 (A) and 8 (B) illustrate a semiconductor device manufactured using the semiconductor device manufacturing method according to the embodiment, where FIG. 8 (A) shows an example to which the present invention is applied and FIG. 8 (B) shows a comparative example.
Figure 8:
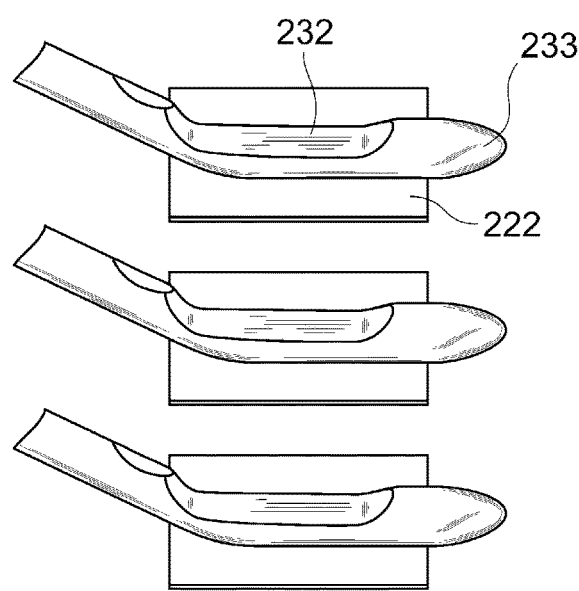

The semiconductor device manufacturing method according to this embodiment can be used to manufacture a semiconductor device shown in FIGS. 7 and 8 (A), for example. It is noted that FIG. 8 (A) is an enlarged perspective view of the semiconductor device shown in FIG. 7 in the vicinity of the first electrode 112 serving as the first bonding point and FIG. 8 (B) illustrates a comparative example (prepared using a conventional method) corresponding to FIG. 8 (A).

As shown in FIG. 7, the semiconductor device 100a includes a first electrode 112 on which the wire tail 43 described in the semiconductor device manufacturing method is bonded as the first bonding point, a second electrode 122 on which the wire 42 is bonded as the second bonding point, and a wire loop 130 extended in a predetermined shape for connection between the first electrode 112 and the second electrode 122. The first electrode and the second electrode, the arrangement thereof having heretofore been described, can be arranged such that for example, multiple first electrodes 112 are formed on the surface of the semiconductor chip 110 (on which semiconductor elements are formed) and each electrode 112 has an exposure region opened through the passivation film (protective film) 114 formed on the surface of the semiconductor chip 110. Also, multiple second electrodes 122 are formed as a part of a wiring pattern formed on the substrate 120.

As shown in FIG. 8 (A), the wire loop 130 has a first bonded portion 132 with respect to the first electrode 112, and a first tip portion 133 of the wire loop 130 on the side of the first electrode 112 is arranged within a region of the first electrode 112 in a plan view (exposed through the passivation film 114) and formed to become integrated with the first bonded portion 132 to form a thin portion thinner than the diameter of the wire. Also, the portion of the wire loop 130 rising from the first electrode 112 is formed with a recessed portion 49. As described in the semiconductor device manufacturing method, the recessed portion 49 is due to a tool impression formed when the opening end portion of the insertion hole 41 of the bonding tool 40 comes into contact with the wire 42.

Here, in the semiconductor device of the comparative example manufactured using the conventional method, as shown in FIG. 8 (B), for example, the first tip portion 233 of the wire loop on the side of the first electrode 222 (first bonding point) is arranged outside a region of the first electrode 222 in a plan view (exposed through the passivation film 114), and the portion between the first bonded portion 232, which is formed as a thin portion through compression using the bonding tool, and the first tip portion 233 is not plastically deformed and thinned to result in having a size approximately equal to the diameter of the wire, though slightly thinned through cutting of the wire.

On the other hand, since the semiconductor device 100a according to this embodiment includes the above-described arrangement of the wire loop 130, the wire material cannot be consumed too much and it is possible to avoid the tip portion of the wire running off the first bonding point to come into contact with another electrode and/or the passivation film, which can avoid or reduce damages to or defects of the semiconductor chip. It is therefore possible to provide a highly reliable semiconductor device that can accommodate a narrow pitch (e.g. a staggered pad arrangement).

The present invention is not limited to the above-described embodiments, but can be applied in various variations.

For example, the X, Y, and Z-directional movement of the bonding tool 40 is not limited to the arrangements described in the examples of the above-described embodiments, but can include, for example, processing drawing not only a linear trajectory but also a curved trajectory. The geometry of the bonding tool 40 is also not limited to that shown.

The examples and applications described through the above-described embodiments of the invention can be combined appropriately depending on the intended use or can be changed or modified for use, and the present invention is not limited to the description of the above embodiments. It is obvious from the description of the appended claims that such combined, changed, or modified modes could also be included within the technical scope of the present invention.

The invention claimed is:

1. A semiconductor device manufacturing method of a semiconductor device having a wire loop for connection between a first bonding point which is one side electrode and a second bonding point which is other side electrode, and the semiconductor device manufacturing method comprising:
    a first bonding step of bonding a wire inserted through a bonding tool to the first bonding point;
    a wire looping step of looping the wire while paying out the wire;
    a second bonding step of bonding the wire to the second bonding point by touching the wire to the second bonding point;
    a cut portion forming step of raising the bonding tool while paying out the wire and moving the bonding tool in a direction from the second bonding point toward the first bonding point to form the cut portion in the wire extending out of a tip of the bonding tool, the cut portion being bent in a vicinity of the second bonding point;

a bonding tool moving step of lowering the bonding tool and moving the tip of the bonding tool to the cut portion of the wire while being pressed against the wire;

a thin portion forming step of lowering the bonding tool vertically toward the second bonding point for compression to thin the cut portion of the wire on a surface of the second bonding point;

a bonding tool raising step of raising the bonding tool while paying out the wire; and a wire tail forming step of moving the bonding tool in a direction away from the first bonding point and the second bonding point and along a wire direction connecting the first bonding point and the second bonding point and then cutting the wire at the cut portion to form a wire tail at the tip of the bonding tool.

2. The semiconductor device manufacturing method according to claim 1, wherein in the cut portion forming step, the bonding tool is raised to a first height;

in the bonding tool moving step, the bonding tool is lowered to a second height lower than the first height and, at the second height, the bonding tool is moved to the cut portion of the wire while the tip of the bonding tool is pressed against the wire; and in the thin portion forming step, the bonding tool is used for compression to a third height lower than the second height.

3. The semiconductor device manufacturing method according to claim 1, wherein in the bonding tool moving step, the tip of the bonding tool is pressed against the wire at a point nearer the first bonding point than the second bonding point.

4. The semiconductor device manufacturing method according to claim 2, wherein in the thin portion forming step, the bonding tool is moved along the wire direction while being kept at the third height.

* * * * *